United States Patent

Sonderman et al.

(10) Patent No.: US 6,708,075 B2
(45) Date of Patent: Mar. 16, 2004

(54) METHOD AND APPARATUS FOR UTILIZING INTEGRATED METROLOGY DATA AS FEED-FORWARD DATA

(75) Inventors: Thomas J. Sonderman, Austin, TX (US); Alexander J. Pasadyn, Austin, TX (US); Christopher A. Bode, Austin, TX (US)

(73) Assignee: Advanced Micro Devices, Austin, TX (US)

( * ) Notice: Subject to any disclaimer, the term of this patent is extended or adjusted under 35 U.S.C. 154(b) by 57 days.

(21) Appl. No.: 09/992,447

(22) Filed: Nov. 16, 2001

(65) Prior Publication Data

US 2003/0097198 A1 May 22, 2003

(51) Int. Cl.[7] .......................... G06F 19/00; H01L 21/66
(52) U.S. Cl. .......................... 700/121; 700/110; 438/14
(58) Field of Search .......................... 700/44, 110, 121; 438/14

(56) References Cited

U.S. PATENT DOCUMENTS

| | | | |
|---|---|---|---|
| 4,796,194 A | 1/1989 | Atherton | 364/468 |
| 5,293,216 A | 3/1994 | Moslehi | 356/371 |
| 5,528,510 A | 6/1996 | Kraft | 364/468 |
| 5,926,690 A | 7/1999 | Toprac et al. | 438/17 |
| 6,197,604 B1 * | 3/2001 | Miller et al. | 438/14 |
| 6,230,069 B1 | 5/2001 | Campbell et al. | 700/121 |
| 6,240,330 B1 * | 5/2001 | Kurtzberg et al. | 700/121 |
| 6,263,255 B1 * | 7/2001 | Tan et al. | 700/121 |
| 6,284,622 B1 | 9/2001 | Campbell et al. | 438/424 |
| 6,304,999 B1 | 10/2001 | Toprac et al. | 716/4 |
| 6,427,093 B1 * | 7/2002 | Toprac | 700/121 |
| 6,460,002 B1 * | 10/2002 | Bone et al. | 702/81 |
| 6,486,492 B1 * | 11/2002 | Su | 257/48 |
| 2002/0088952 A1 * | 7/2002 | Rao et al. | 250/559.45 |
| 2002/0165636 A1 * | 11/2002 | Hasan | 700/121 |
| 2002/0188414 A1 * | 12/2002 | Nulman | 702/119 |
| 2002/0193902 A1 * | 12/2002 | Shanmugasundram et al. | 700/121 |
| 2002/0199082 A1 * | 12/2002 | Shanmugasundram et al. | 712/208 |
| 2003/0040830 A1 * | 2/2003 | Parikh et al. | 700/121 |

FOREIGN PATENT DOCUMENTS

| | | | | |
|---|---|---|---|---|
| EP | 1 079 428 A2 | 2/2001 | | H01L/21/66 |
| WO | 01/50520 A1 | 7/2001 | | H01L/21/66 |

OTHER PUBLICATIONS

US 6,150,664, 11/2000, Su (withdrawn)
International Search Report dated Feb. 13, 2002 for International application No. PCT/US01/21338 Filed Jul. 3, 2001.
U.S. Patent Publication No. 2001/0041377 A1 entitled, *Method of Manufacturing Semiconductor Device*, Nov. 15, 2001, 23 pages.

* cited by examiner

*Primary Examiner*—Leo Picard
*Assistant Examiner*—Elliot Frank
(74) *Attorney, Agent, or Firm*—Williams, Morgan & Amerson, P.C.

(57) ABSTRACT

A method and an apparatus for performing feed-forward correction during semiconductor wafer manufacturing. A first process on a semiconductor wafer is performed. Integrated metrology data related to the first process of the semiconductor wafer is acquired. An integrated metrology feed-forward process is performed based upon the integrated metrology data, the integrated metrology feed-forward process comprising identifying at least one error on the semiconductor wafer based upon the integrated metrology data related to the first process of the semiconductor wafer and performing an adjustment process to a second process to be performed on the wafer to compensate for the error. The second process on the semiconductor wafer is performed based upon the adjustment process.

22 Claims, 10 Drawing Sheets

METHOD AND APPARATUS FOR UTILIZING INTEGRATED METROLOGY DATA AS FEED-FORWARD DATA

BACKGROUND OF THE INVENTION

1. Field of the Invention

This invention relates generally to semiconductor manufacturing, and, more particularly, to a method and apparatus using metrology data from an integrated source for feed-forward data for down-stream processing.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot. For example, a process layer composed of a variety of materials may be formed above a wafer. Thereafter, a patterned layer of photoresist may be formed above the process layer using known photolithography techniques. Typically, an etch process is then performed on the process layer using the patterned layer of photoresist as a mask. This etching process results in formation of various features or objects in the process layer. Such features may be used for a gate electrode structure for transistors. Many times, trench structures are also formed on the substrate of the semiconductor wafer to isolate electrical areas on a semiconductor wafer. One example of an isolation structure is a shallow trench isolation (STI) structure, which can be used. Typically, STI structures formed on the semiconductor wafers by forming trenches in the wafer and filling such trenches with an insulating material, such as silicon dioxide.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

Figure 1:
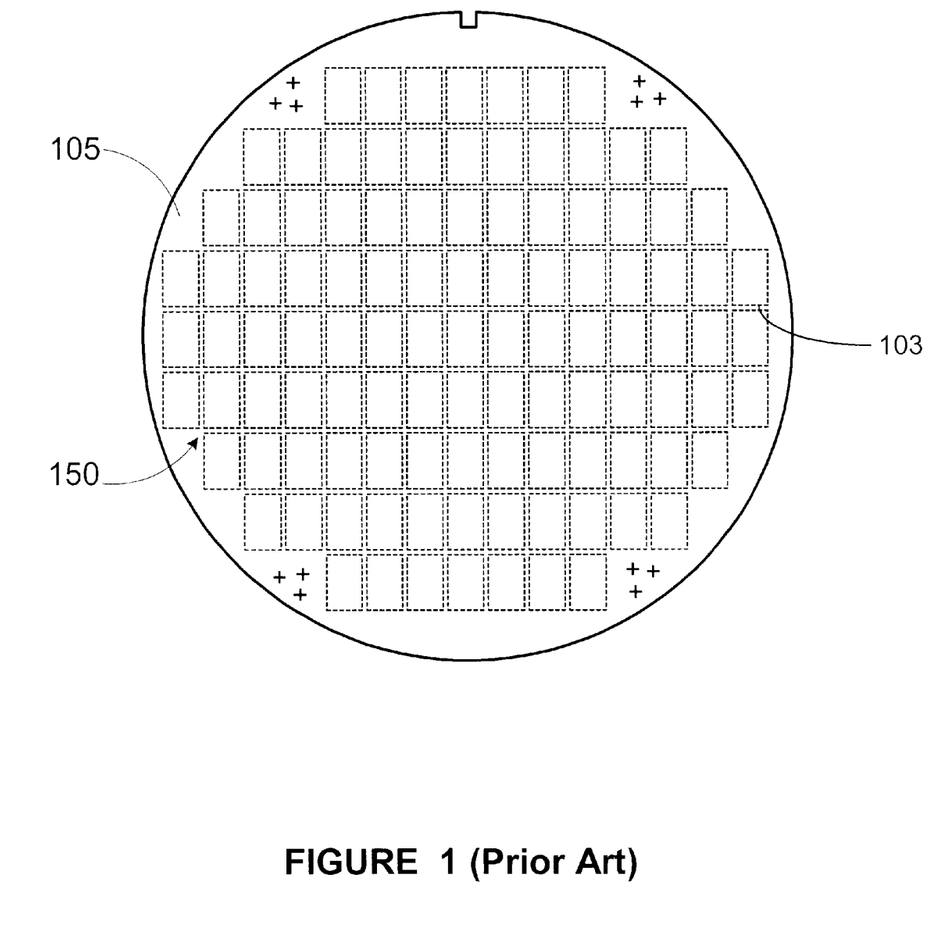
FIG. 1 is a simplified diagram of a prior art semiconductor wafer being processed.

FIG. 1 illustrates a typical semiconductor wafer 105. The wafer 105 typically includes a plurality of individual semiconductor die 103 arranged in a grid 150. Photolithography steps are typically performed by a stepper on approximately one to four die locations at a time, depending on the specific photomask employed. Photolithography steps are generally performed to form a patterned layer of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features, such as a polysilicon line, or opening-type features, that are to be replicated in an underlying process layer.

Figure 2:
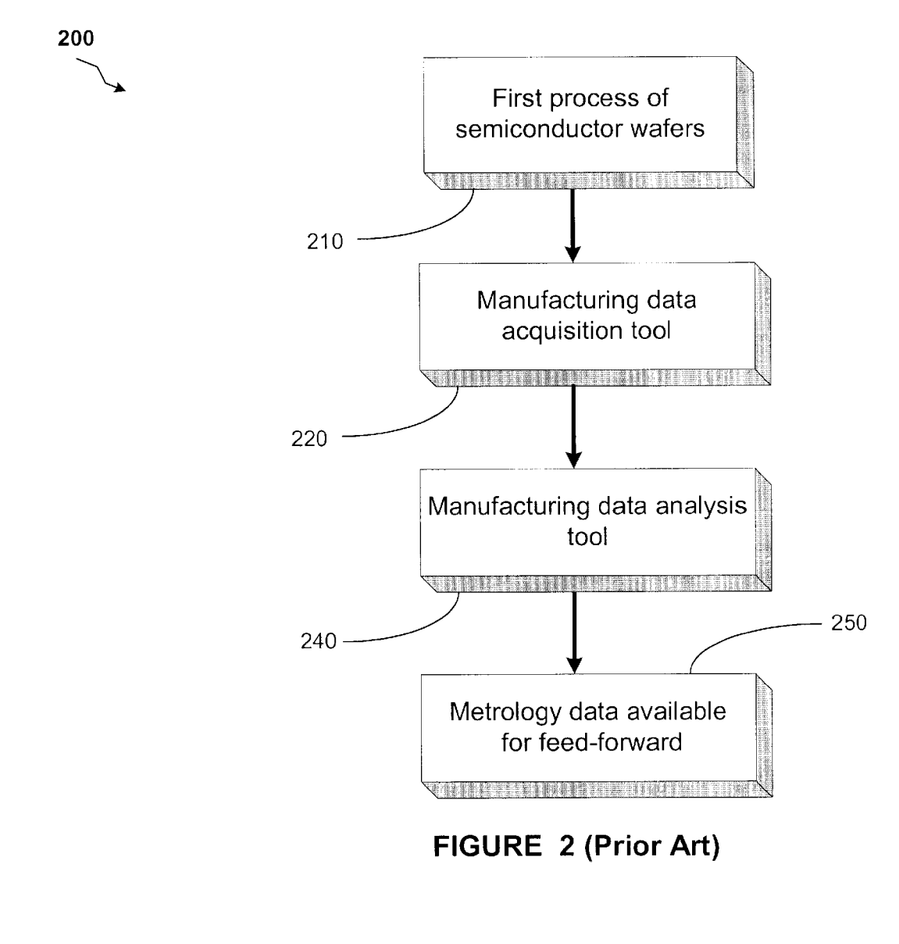
FIG. 2 illustrates a simplified flowchart depiction of a prior art process flow during manufacturing of semiconductor wafers.

Turning now to FIG. 2, one example of a block diagram representation of a typical manufacturing process flow is illustrated. A manufacturing system 200 prompts a first processing tool 210 to perform a first processes (block 210). A manufacturing data acquisition tool 220 (e.g., a metrology tool) then analyzes at least some of the processed semiconductor wafers 105. Wafers 105 upon which the first processing operation are analyzed by the manufacturing data acquisition tool 220 to acquire manufacturing data that can be analyzed (block 240).

The analyzed data can be then used to adjust various parameters related to manufacturing control of subsequent processes, in order to reduce the effects of existing manufacturing errors. Once the manufacturing data analysis is performed, manufacturing data for feed-forward corrections is made available to the system 200 (block 250). The system 200 then uses the feed-forward data to perform corrections on subsequent processes performed by a processing tool.

Generally, feed-forward data that is used to correct process deviations to reduce the effects of errors is acquired in an offline manner. For example, once a particular process is performed on a lot of semiconductor wafers 105, the manufacturing procedure is temporarily interrupted while manufacturing data is acquired. The manufacturing data is then analyzed to produce possible feed-forward correction data to subsequent processing performed on the lot of semiconductor wafers 105.

The interruption suffered by the manufacturing line to produce feed-forward data can cause inefficiencies in a manufacturing environment. Any pause or interruption in manufacturing can be costly and can cause further deviations in critical accuracies that are needed for proper manufacturing of semiconductor wafers 105. Furthermore, the feed-forward correction data that is produced by the manufacturing system 200 of FIG. 2 is generally available too late for use in a second processing operation, or else the second processing operation may be delayed for an undesirable period of time awaiting such data. Thus, semiconductor wafers 105 with non-corrected errors may be produced by the manufacturing system 200. Devices produced from the processed semiconductor wafers 105 may contain excessive amounts of errors, which can adversely affect the overall yield of the manufacturing process. Furthermore, inefficiencies due to many of the current manufacturing correction procedures can prove to be very costly.

The present invention is directed to overcoming, or at least reducing the effects of, one or more of the problems set forth above.

SUMMARY OF THE INVENTION

In one aspect of the present invention, a method is provided for performing feed-forward correction during semiconductor wafer manufacturing. A first process on a semiconductor wafer is performed. Integrated metrology data related to the first process of the semiconductor wafer is acquired. An integrated metrology feed-forward process is performed based upon the integrated metrology data, the integrated metrology feed-forward process comprising identifying at least one error on the semiconductor wafer based upon the integrated metrology data related to the first process of the semiconductor wafer and performing an adjustment process to a second process to be performed on the wafer to compensate for the error. The second process on the semiconductor wafer is performed based upon the adjustment process.

In another aspect of the present invention, a system is provided for performing feed-forward correction during semiconductor wafer manufacturing. The system of the present invention comprises a process controller to perform an integrated metrology feed-forward operation, the integrated metrology feed-forward operation comprising: acquiring integrated metrology data related to a first process of a semiconductor; identifying an error on the semiconductor wafer based upon the integrated metrology data related the first process; calculating a compensation factor for reducing an effect of the identified error; modifying a control input parameter relating to a second process to be performed on the wafer based upon the compensation factor; performing a second process of the semiconductor wafer based upon the modified control input parameter; an integrated metrology data storage unit operatively coupled to the process controller, the integrated metrology data storage unit to receive the integrated metrology data; and a feed-forward unit operatively coupled to the process controller and the integrated metrology data storage unit, the feed-forward unit to perform the feed-forward function in response to identifying at least one error relating to the process of the semiconductor wafer.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Often, at least a portion of a manufacturing lot of semiconductor wafers are examined by offline metrology tools after a process operation is performed in the semiconductor wafers. Errors discovered during this examination can be used to generate modifications for subsequent processes performed on the semiconductor wafers. These modifications to the new process are generally used to reduce the effects of errors discovered in the original process. Many times, offline metrology data results become available too late for performing such downstream modifications in a timely manner. Embodiments of the present invention provide for performing integrated metrology data acquisition for more efficient and meaningful feed-forward modifications to subsequent processes. Embodiments of the present invention provide for acquiring metrology data during a manufacturing process and performing corrective modifications to a subsequent process such that the effects of the errors caused in an earlier process is reduced.

In one embodiment, offline metrology data includes metrology data that is not part of the production flow during processing of semiconductor wafers 105. For example, offline metrology data may refer to electrical test results of the processed semiconductor wafers 105, yield of the processed semiconductor wafers 105, and the like. In one embodiment, integrated metrology data may include inline metrology data. In one embodiment, inline metrology data includes metrology data acquired by a standalone metrology tool yielding data associated with a particular processing operation. For example, inline metrology data may include data relating to film thickness, line-width of certain formations on processed semiconductor wafers 105, overlay measurements resulting from photolithography measurements, and the like. An integrated metrology tool, which is described in greater detail below, may be used to acquire integrated metrology data. In one embodiment, integrated metrology data includes inline metrology data that is acquired by a metrology tool integrated into a processing tool, which is described in greater detail below.

Figure 3:
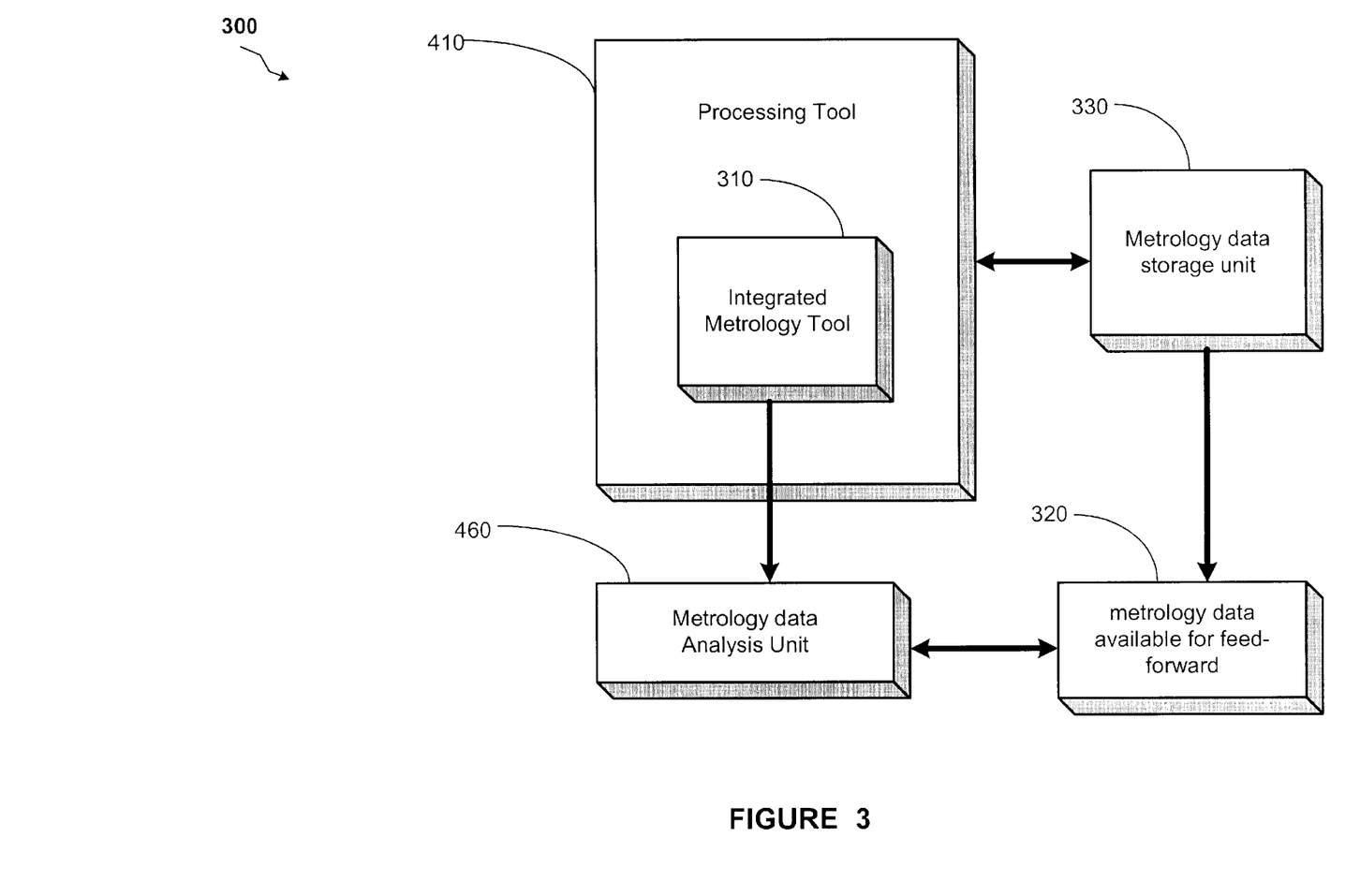
FIG. 3 is a block diagram representation of a system in accordance with one illustrative embodiment of the present invention.

Turning now to FIG. 3, a system 300 capable of performing the methods taught by one embodiment of the present invention, is illustrated. In one embodiment, a processing tool 410 comprises an integrated metrology tool 310. In one embodiment, the integrated metrology tool 310 may be incorporated into the flow of semiconductor wafers 105 through a processing tool 410. In other words, the semiconductor wafers 105 generally pass through the integrated metrology tool 310, as the wafers 105 would pass through other processing stations (not shown) on the processing tool 410. The integrated metrology tool 310 is capable of acquiring integrated metrology data (e.g., acquiring metrology data of semiconductor wafers 105 while they are still under the control of the processing tool 410). Acquiring inline metrology data is generally less intrusive to a manufacturing process flow, as compared to acquiring offline metrology data, which requires the use of an external metrology data tool.

The integrated metrology tool 310 acquires metrology data in an inline fashion. In other words, during, or immediately following a manufacturing process, the integrated metrology tool 310 acquires data from the processed semiconductor wafers 105. In one embodiment, the integrated metrology tool 310 is placed within a chamber (not shown) associated with the processing tool 410. In one embodiment, the integrated metrology tool 310 sends metrology data (real-time or near real-time data) to a metrology data storage unit 330. The metrology data storage unit 330 stores the metrology data such that it can be retrieved by the system 300 for further analysis during or after a manufacturing process cycle.

Data from the integrated metrology tool 310 may also be sent to the metrology data analysis unit 460. The metrology analysis unit is capable of correlating particular metrology data to corresponding semiconductor wafers 105. In one embodiment, metrology data analysis unit 460 also sends metrology data to the metrology storage unit 330 for storage. The real-time, or near real-time, metrology data stored in the metrology data storage unit 330 provides the system 300 access to immediate manufacturing data that can be used to further correct or enhance the accuracy of one or more processes performed on the semiconductor wafers 105.

Figure 4:
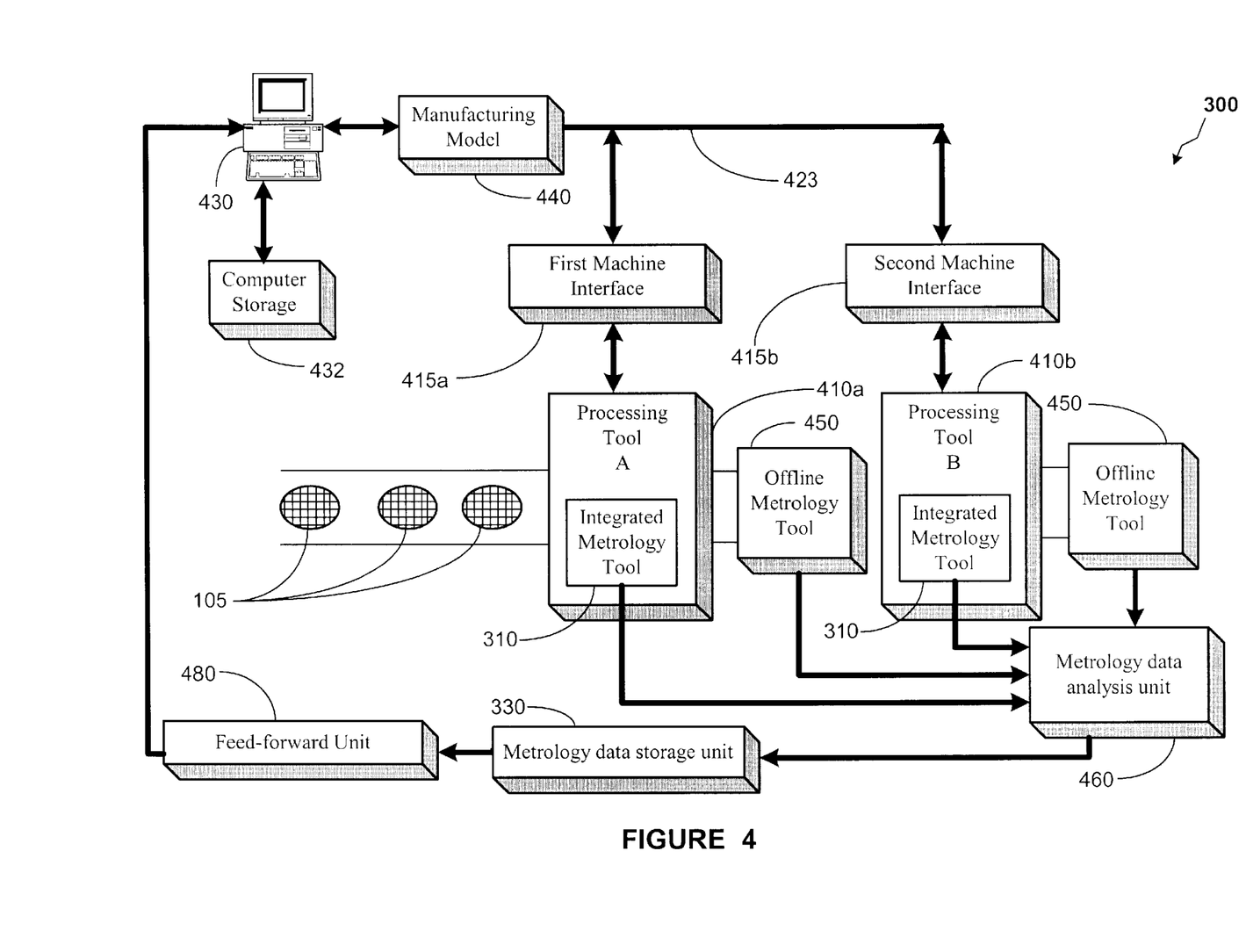
FIG. 4 illustrates a more detailed block diagram representation of the system shown in FIGS. 3 and 4, in accordance with one illustrative embodiment of the present invention.

Turning now to FIG. 4, a more detailed block diagram of the system 300 in accordance with one embodiment of the present invention is illustrated. In one embodiment, semiconductor wafers 105, are processed on processing tools 410a, 410b using a plurality of control input signals, or manufacturing parameters, provided via a line or network 423. In one embodiment, control input signals, or manufacturing parameters, on the line 423 are sent to the processing tools 410a, 410b from a computer system 430 via machine interfaces 415a, 415b. In one embodiment, the first and second machine interfaces 415a, 415b are located outside the processing tools 410a, 410b. In an alternative embodiment, the first and second machine interfaces 415a, 415b are located within the processing tools 410a, 410b. The semiconductor wafers 105 are provided to and carried from a plurality of processing tools 410. In one embodiment, semiconductor wafer 105 may be provided to a processing tool 410 manually. In an alternative embodiment, semiconductor wafer 105 may be provided to a processing tool 410 in an automatic fashion (e.g., robotic movement of semiconductor wafer 105). In one embodiment, a plurality of semiconductor wafers 105 are transported in lots (e.g., stacked in cassettes) to the processing tools 410.

In one embodiment, the computer system 430 sends control input signals, or manufacturing parameters, on the line 423 to the first and second machine interfaces 415a, 415b. The computer system 430 is capable of controlling processing operations. In one embodiment, the computer system 430 is a process controller. The computer system 430 is coupled to a computer storage unit 432 that may contain a plurality of software programs and data sets. The computer system 430 may contain one or more processors (not shown) that are capable of performing the operations described herein. The computer system 430 employs a manufacturing model 440 to generate control input signals on the line 423. In one embodiment, the manufacturing model 440 contains a manufacturing recipe that determines a plurality of control input parameters that are sent on the line 423 to the processing tools 410a, 410b.

In one embodiment, the manufacturing model 440 defines a process script and input control that implement a particular manufacturing process. The control input signals (or control input parameters) on the line 423 that are intended for processing tool A 410a are received and processed by the first machine interface 415a. The control input signals on the line 423 that are intended for processing tool B 410b are received and processed by the second machine interface 415b. Examples of the processing tools 410a, 410b used in semiconductor manufacturing processes are steppers, etch process tools, deposition tools, and the like.

One or more of the semiconductor wafers 105 that are processed by the processing tools 410a, 410b can also be sent to an offline metrology tool 450 for acquisition of metrology data. The offline metrology tool 450 can be a scatterometry data acquisition tool, an overlay-error measurement tool, a critical dimension measurement tool, and the like. In one embodiment, one or more processed semiconductor wafers 105 are examined by a metrology tool 450. Furthermore, metrology data may also be collected by the integrated metrology tool 310 within the processing tools 410a and 410b. Data from the integrated metrology tool 310 and the offline metrology tool 450 may be collected by the metrology data analyzer unit 460. The metrology data be directed to a variety of physical or electrical characteristics of the devices formed on the wafers 105. For example metrology data may be obtained as to line width measurements, depth of trenches, sidewall angles, thickness, resistance, and the like. As described above, the metrology data analyzer unit 460 organizes, analyses, and correlates metrology data acquired by the offline metrology tool 450 to particular semiconductor wafers 105 that were examined.

In one embodiment, the metrology data analysis unit 460 sends metrology data (including inline-type metrology data) and offline metrology data, from the integrated metrology tool 310 and offline metrology tool 450, respectively, to the metrology data storage unit 330 for storage. The system 300 is able to retrieve inline metrology data and offline metrology data and perform feed-forward analysis. Based upon specific request for data, the inline metrology data and the offline metrology data are sent to the feed-forward unit 480 for generation of feed-forward data. In one embodiment, the system 300 calculates adjustments to subsequent process so that the effects of the errors in previous processing operation performed on the semiconductor wafers 105 are reduced.

In one embodiment, the feed-forward unit 480 is capable of calculating adjustment data that can be used to modify the control input parameters provided to one or more processing tools that will subsequently perform various processes on the semiconductor wafers 105. The modification of the control input parameters are designed to reduce the effects of errors discovered on the semiconductor wafers 105. The feed-forward data is analyzed by the computer system 430, which then uses the manufacturing model 440 to modify control input parameters that control the operation of the processing tools 410. In one embodiment, the metrology data storage unit 330, the metrology data analysis unit 460, and/or the feed-forward unit 480 are software or firmware components of a computer system that can be standalone unit or that can be integrated into the computer system 430.

Figure 5:
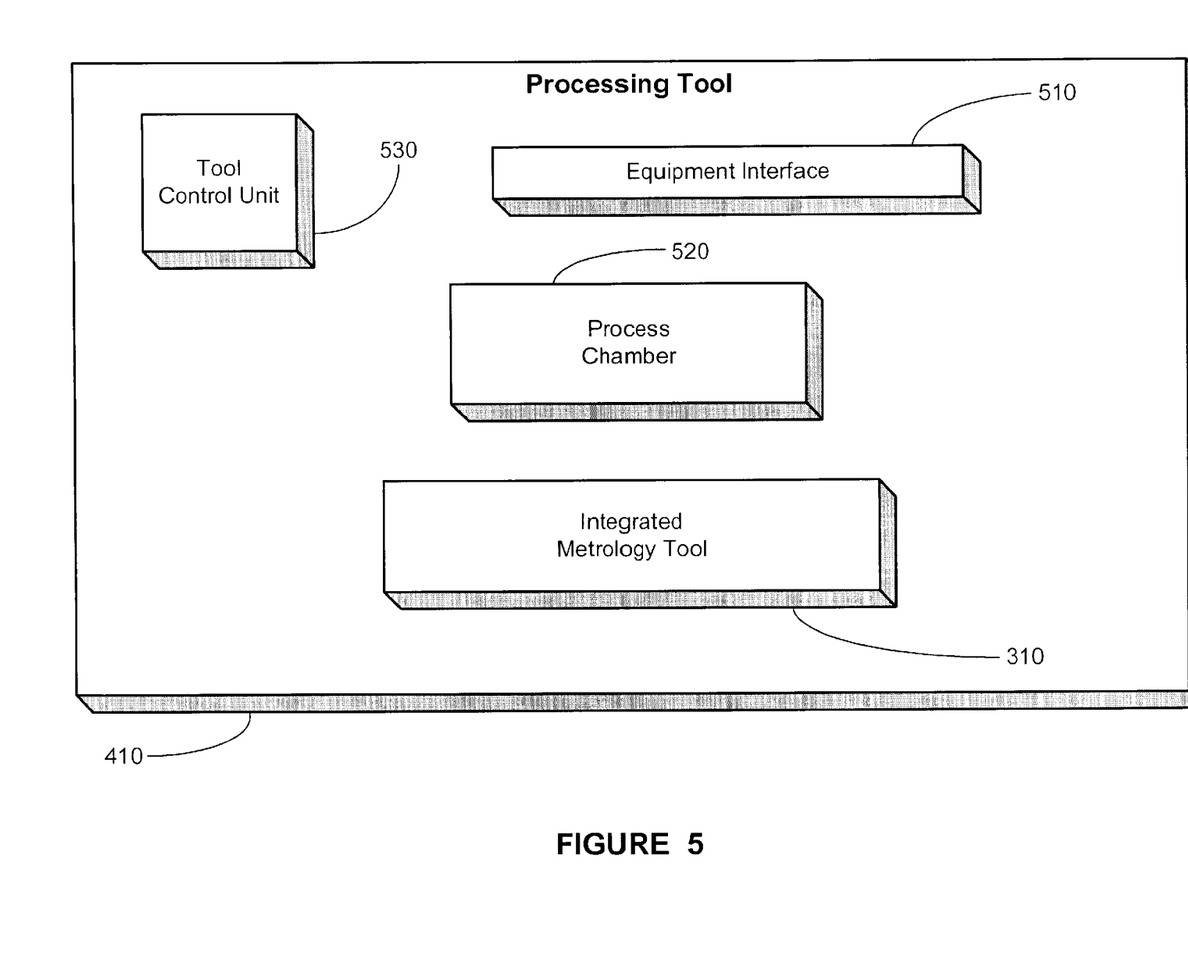
FIG. 5 illustrates a more detailed block diagram representation of a processing tool shown in FIGS. 3 and 4, in accordance with one illustrative embodiment of the present invention.

Turning now to FIG. 5, a more detailed block diagram illustration of an illustrative processing tool, such as processing tool 410a is shown. In one embodiment, the processing tool 410a comprises an equipment interface 510, a process chamber 520, a processing tool control unit 530, and an integrated metrology tool 310. The processing tool 410a receives control parameter data via the equipment interface 510. Data from the processing tool 410a is also sent to other portions of the system 300, such as the computer system 430, via the equipment interface 510. The processing tool control unit 530 controls processing operations of semiconductor wafers 105 in the chamber 520. The tool control unit 530 receives control parameter data, and/or instructions from the computer system 430, via the equipment interface 510, and executes the appropriate action.

The integrated metrology tool 310 acquires metrology data of the semiconductor wafers 105 that were processed in the chamber 520. The processing control unit 530 also controls the integrated metrology tool 310. In accordance with embodiments of the present invention, the integrated metrology tool 310 acquires real-time or near real-time metrology data from semiconductor wafers 105 processed, and makes such data available to the system 300 for more efficient and quick analysis of metrology data.

Figure 6:
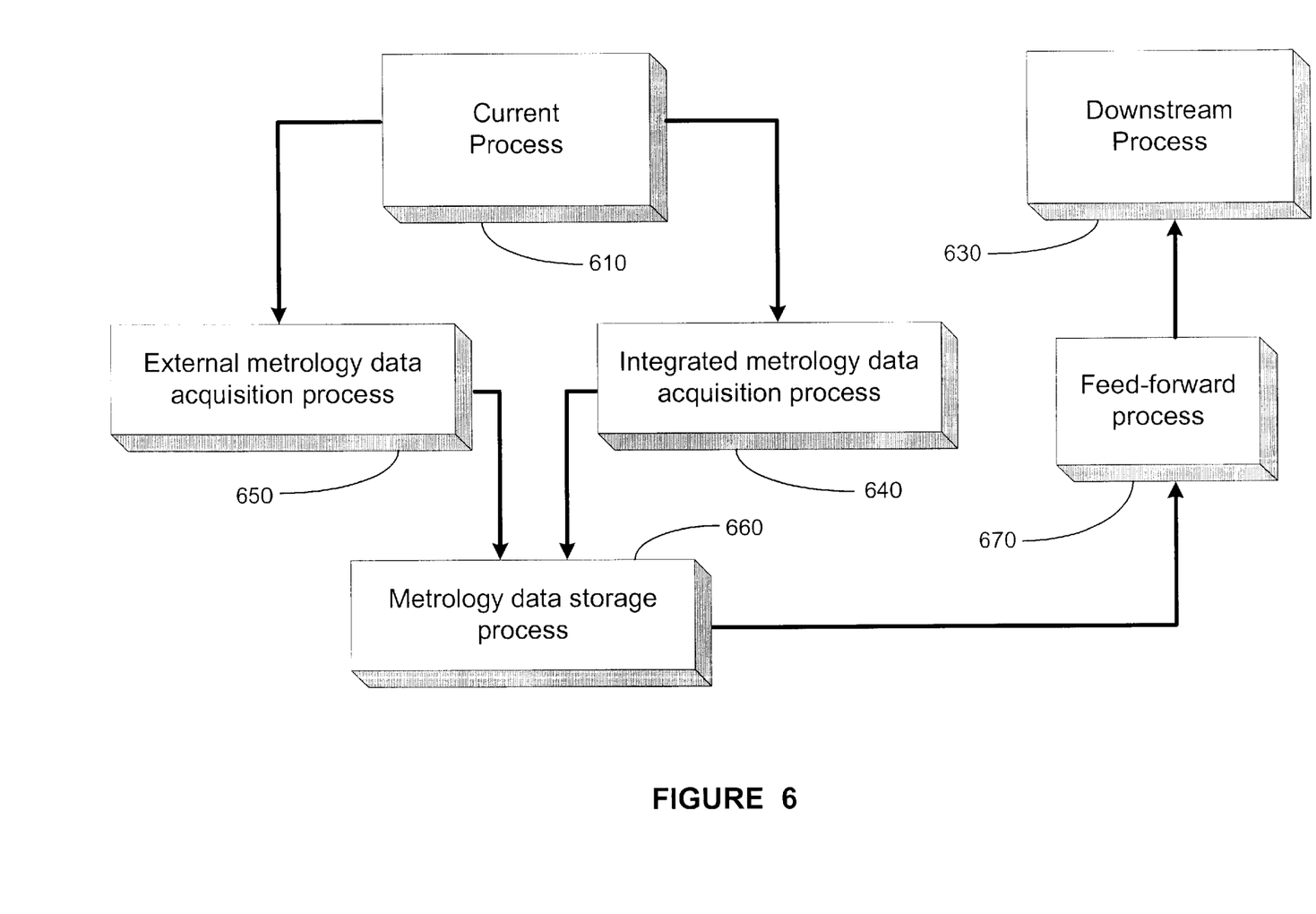
FIG. 6 illustrates a block diagram representation of a process flow in accordance with one illustrative embodiment of the present invention.

Turning now to FIG. 6, a block diagram representation of the manufacturing flow in accordance with one embodiment of the present invention is illustrated. A current process 610 is performed on a semiconductor wafer 105. The current process can be a photolithography process, an etch process, a chemical-mechanical polishing (CMP) process and the like. Either after or during the performance of the current process, the system 300 performs an inline metrology data acquisition process (block 640) in order to acquire real-time or near real-time metrology data.

The system 300 performs a current process 610 as indicated by block 610 that is associated with a downstream process 630. The downstream process 630 is generally a manufacturing process that is performed on semiconductor devices 105 after the current process 610 is performed. For example, the current process may consist of depositing a layer of process material on the semiconductor wafer 105, whereas the downstream process 630 etches away certain portions of the deposited layer. As another example, the upstream process 630 may be an etch process, and the downstream process may be a polishing process.

Once the current process 610 is performed on a predetermined number of semiconductor wafers 105, an external metrology data acquisition process 650 may be performed (block 650). The external metrology data acquisition process comprises extracting processed semiconductor wafers 105 from the manufacturing flow, and acquiring offline metrology data. In both cases, the offline metrology data and the integrated metrology data (including inline metrology data) are stored in the metrology storage facility for retrieval by the system 300 (block 660). In one embodiment, metrology data from the metrology data storage process 660 is sent to a feed-forward process (block 670). Generally, the feed-forward process 670 is used to determine control input parameters to perform a downstream process as indicated by FIG. 6. For example, if an excessive amount of material is deposited during the current process 610, feed-forward corrections can be made to downstream process 630 in order to compensate for the excessive deposition of processing material. The compensation made to a downstream process 630 may involve adjusting one or more process variables of the downstream process. For example, the compensation may include increasing the etch time to compensate for excessive deposition of process material on a layer of the semiconductor wafer 105.

Figure 7:
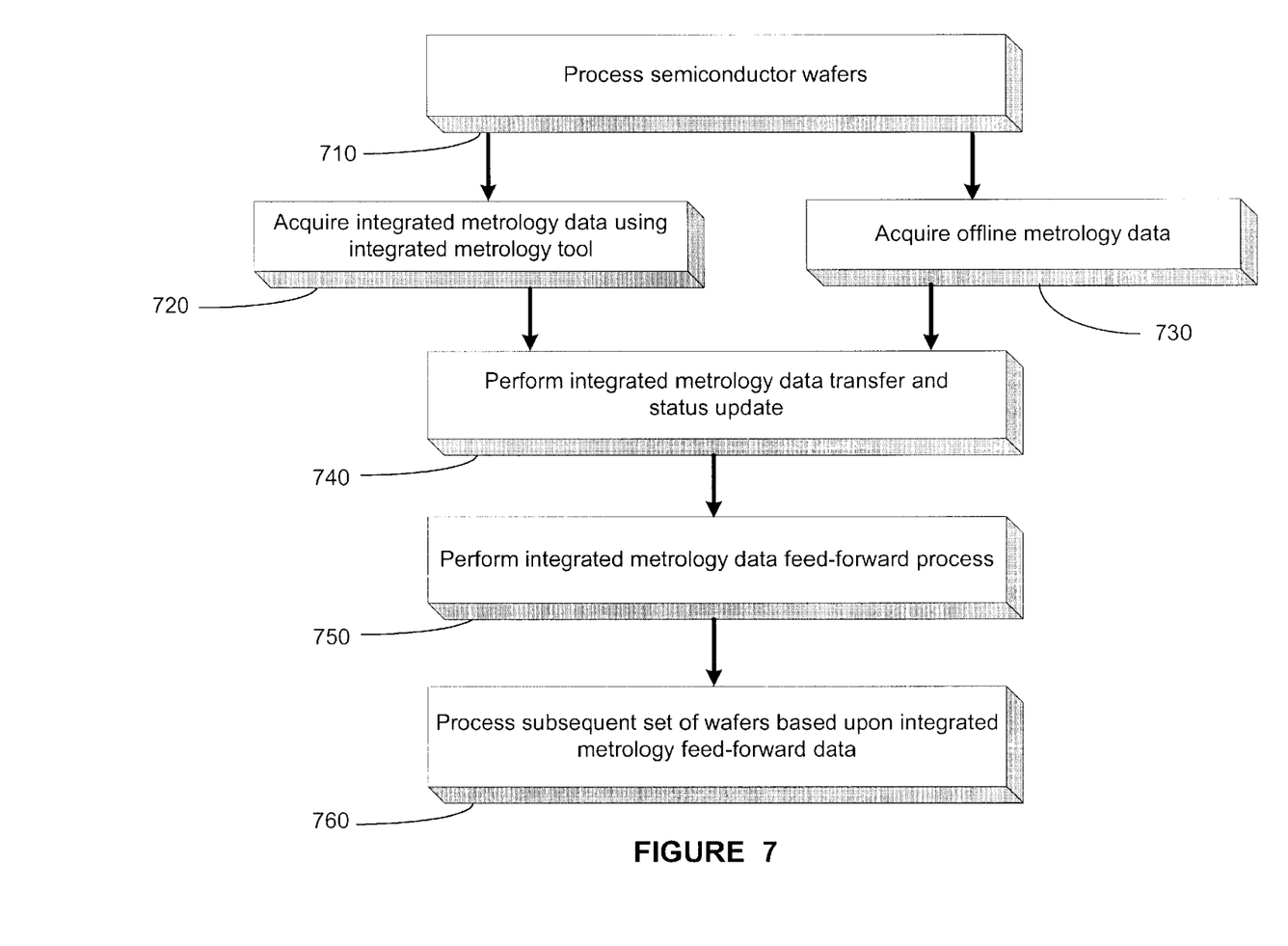
FIG. 7 illustrates a flowchart depiction of a method in accordance with one illustrative embodiment of the present invention.

Turning now to FIG. 7, a flowchart representation of a method in accordance with one embodiment of the present invention is illustrated. A semiconductor wafer 105 is processed by the system 300 (block 710). The process performed on the semiconductor wafer 105 may be any of a variety of processing operations commonly performed in modern integrated circuit manufacturing facilities, e.g., a photolithography process, an etch process, a CMP process, and the like. Upon processing of the semiconductor wafer 105, integrated metrology data from the processed semiconductor wafer 105 may be acquired by the system 300 using the integrated metrology tool 310 (block 720). In one embodiment, the integrated metrology tool 310 acquires integrated metrology data. In an alternative embodiment, offline metrology data is acquired from the processed semiconductor wafer 105 (block 730). The offline metrology data may be acquired by offline metrology tool 450. A more detailed illustration of the steps for acquiring integrated metrology data is provided in FIG. 8 and by the accompanying description provided below.

Once the integrated metrology data is acquired by the system 300, the system 300 performs an integrated metrology data and status update (block 740). In other words, the newly acquired integrated metrology data (e.g., inline data acquired by the integrated metrology tool 310) is added to the metrology data storage unit 330. The processing tool 410 updates the system 300 regarding the availability of the newly acquired integrated metrology tool. Accordingly, the system 300 can recognize when real-time or near real-time data is available. A more detailed description of performing integrated metrology data transfer and status update is provided in FIG. 9 and by its accompanying description below.

In one embodiment, the system 300 also performs an integrated metrology feed-forward process (block 750). The integrated metrology feed-forward process provides for corrective measures in subsequent processing of previously processed semiconductor wafers 105, such that the effects of the errors from the previous process or processes are reduced. Once the system performs an integrated metrology data feed-forward process, the system 300 performs subsequent processes on the semiconductor wafers 105 (block 760).

Figure 8:
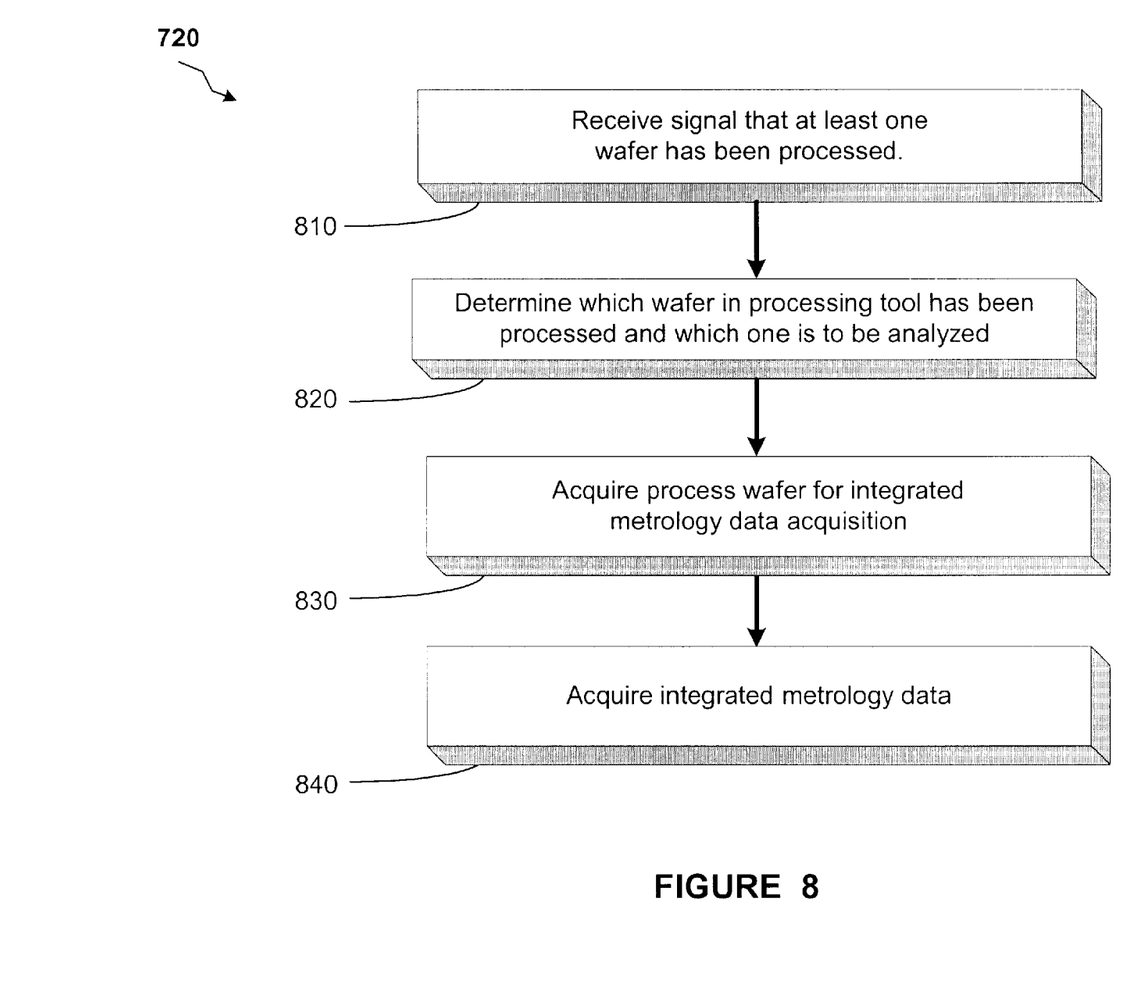
FIG. 8 illustrates a flowchart depiction of a method of acquiring integrated metrology data, as indicated in FIG. 7, in accordance with one illustrative embodiment of the present invention.

Turning now to FIG. 8, is a flowchart depiction of one illustrative embodiment of a method for acquiring integrated metrology data. After the system 300 processes a semiconductor wafer 105, a signal is received by the system indicating that at least one semiconductor wafer 105 has been processed (block 810). In one embodiment, the equipment interface 510 sends a signal to the computer system 430, indicating the status of a process completion. When the system 300 learns that a semiconductor wafer 105 has been processed, it makes a determination as to which semiconductor wafer 105 in the tool has been processed and is next in queue for metrology analysis (block 820). Generally, the order of metrology analysis performed on the semiconductor wafers 105 follows the order of processing within the processing tool 410. Once the system 300 determines and targets a particular semiconductor wafer 105 for inline metrology analysis, the system 300 acquires that particular wafer 105 for integrated metrology data acquisition (block 830).

The system 300 then acquires integrated metrology data from the targeted semiconductor wafer 105 (block 840). The integrated metrology tool 310 within the processing tool 410 acquires the metrology data. In one embodiment, integrated metrology data is acquired immediately after the processing of a particular semiconductor wafer 105. Therefore, real time or near real time metrology data is provided to the system 300. The completion of the steps illustrated in FIG. 8 substantially completes the process of acquiring integrated metrology data, as indicated in block 720, FIG. 7.

Figure 9:
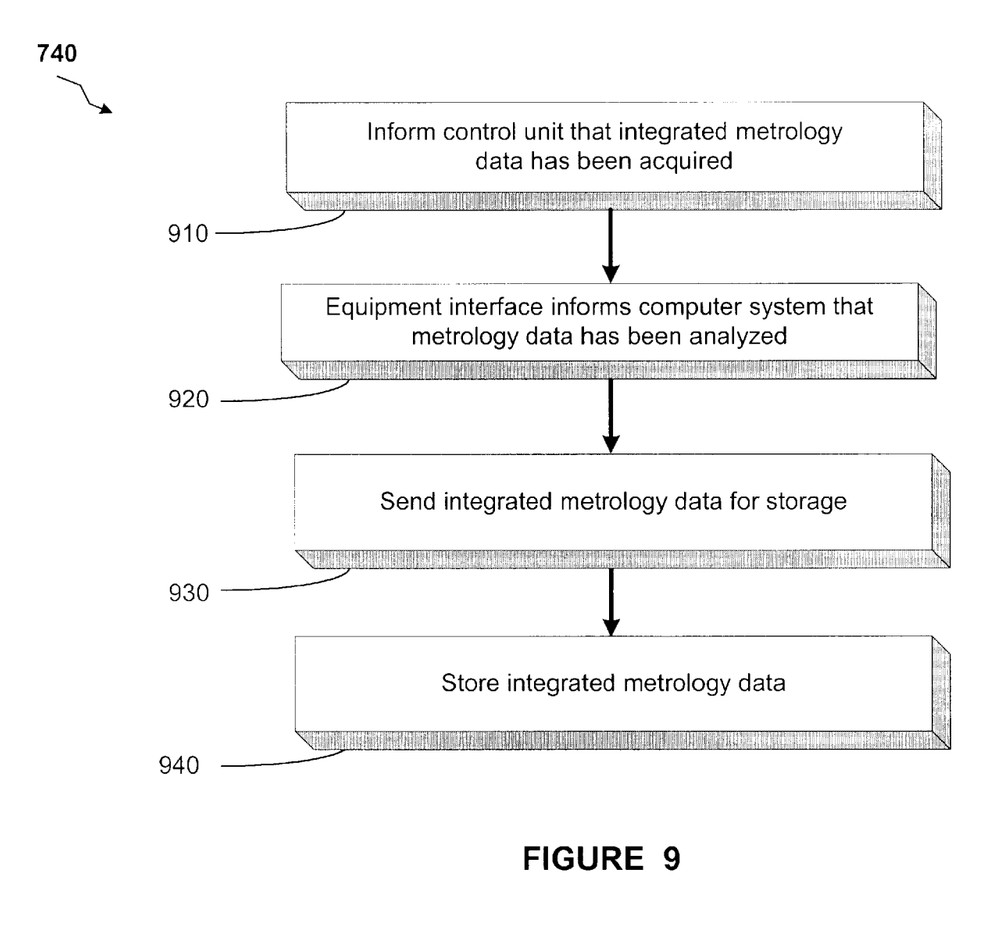
FIG. 9 illustrates a flowchart depiction of a method of performing integrated metrology data transfer and status update, as indicated in FIG. 7, in accordance with illustrative one embodiment of the present invention.

FIG. 9 is a flowchart representation of the method for performing an integrated metrology data transfer and status update, as described in block 740 of FIG. 7. As shown herein, once the system 300 acquires integrated metrology data, the system 300 informs the process tool control unit 530 that integrated metrology data has been acquired (block 910). The process control unit 530 then communicates with the equipment interface 510, which informs the computer system 430 that integrated metrology data is available (block 920), so that the computer system 430 can execute an efficient reaction to the integrated metrology data.

In one embodiment, communication with the computer system 430 is performed via the machine interface 415. The system 300 then sends the integrated metrology data for storage from the processing tool 410 (block 930). In one embodiment, the integrated metrology data is sent via the equipment interface 510 and the machine interface 415 onto the computer system 430. In one embodiment, the computer system 430 stores the integrated metrology data into the metrology data storage unit 330 for later retrieval (block 940). The process tool control unit 530 also sends a status to the computer system 430 indicating that a particular integrated metrology data is available. Completion of the steps described in FIG. 9 essentially completes the process of performing integrated metrology data transfer and status update as indicated of block 740 of FIG. 7.

Figure 10:
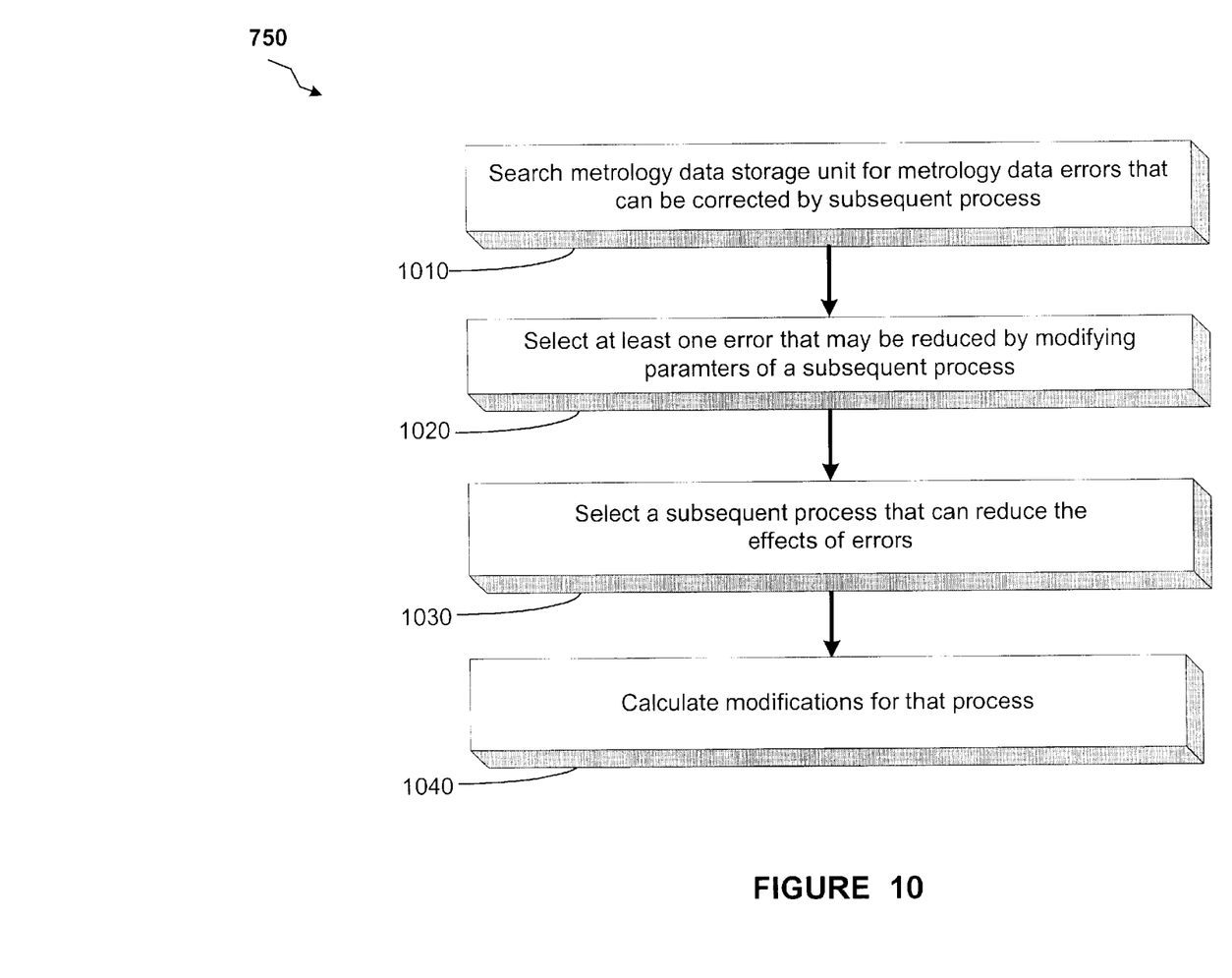
FIG. 10 illustrates a flowchart depiction of a method of performing an integrated metrology feed-forward process, as indicated in FIG. 7, in accordance with one illustrative embodiment of the present invention.

FIG. 10 is a flowchart depiction of one embodiment of performing an integrated metrology feed-forward process, as described in block 760 of FIG. 7. As shown herein, the system 300 searches for metrology data errors that can be corrected by one or more subsequent processes (block 1010). Many times, errors on semiconductor wafers 105 that are outside of a predetermined range of tolerance, can cause malfunction in devices that are produced from the semiconductor wafer 105. Effects of errors during the processing of a semiconductor wafer 105 can be reduced by performing adjustments to subsequent processes performed on the semiconductor wafer 105. For example, during an etch process, if a deposited process layer is formed too thick relative to a predetermined allowable thickness specification, a subsequent process, such as an etch process, can be modified to compensate for the error that occurred during the deposition process. For example, the duration of the etch process may be increased.

In one embodiment, the system 300 searches for metrology data errors in the metrology data storage unit 330. One advantage of using an integrated metrology data system provided by the present invention is that real-time or near real-time data can be quickly acquired such that a process that is immediately subsequent to a previous process can be used to correct the errors that occurred during the previous process. In other words, it may easier to quickly compensate for errors that occur during a processing of semiconductor wafer 105 using integrated metrology data, before the errors trickles down to subsequent processes in a manufacturing line.

Once the system 300 finds metrology errors that can be reduced or corrected by a subsequent process operation, the system 300 selects at least one particular error that may be reduced or corrected by modifying control input parameters of a subsequent process (block 1020). For example, a line width error in a patterned layer of photoreisit that occurred during a photolithography process may be substantially corrected by modifying a control input parameter that controls the operation of a subsequent etch process, resulting in reduced effects of the original error.

Once the system 300 selects an error that may be compensated for by a subsequent process, the system 300 selects a subsequent process that can reduce the effects of the selected error(s) (block 1030). For example, the system 300 selects a subsequent etch process and modifies control input parameters that control the etch process to reduce the effects of a line-width errors in a patterned layer of photoresist that occurred during a previous photolithography process. Once the system 300 selects a subsequent process to reduce effects of a previous error, the system 300 calculates modifications (compensation factors) for that particular process (block 1040). For example, calculated modifications are used to reduce the line width errors in a patterned layer of photoresist may include extending the time period for etching. Depending upon the particular error found, other modifications may be made to other processes, e.g., calculating a modified chemical mechanical polishing time and calculating a modified exposure dosage for an ion implant process, etc. The system 300 then utilizes the modified control parameters to process the semiconductor wafers 105 as indicated in FIG. 7. The completion of the steps described in FIG. 10 substantially completes the process of performing an integrated metrology feed-forward process indicated in block 760 of FIG. 7. The teachings of the present invention can be utilized for a variety of processing procedures in semiconductor device manufacturing.

The principles taught by the present invention can be implemented in an Advanced Process Control (APC) Framework, such as a CATALYST™ system offered by KLA TENCOR, INC. The CATALYST™ system (APC Framework) uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a first process on a semiconductor wafer using a processing tool;
    acquiring integrated metrology data related to said first process of said semiconductor wafer said integrated metrology data comprising data acquired using a metrology tool that is integrated within said processing tool, acquiring said integrated metrology data comprising receiving notification of completion of said first process and identifying said semiconductor wafer for acquiring integrated metrology data;
    performing an integrated metrology data feed-forward process based upon said integrated metrology data, said integrated metrology feed-forward process comprising identifying at least one error on said semiconductor wafer based upon said integrated metrology data related to said first process of said semiconductor wafer and performing an adjustment process to a second process to be performed on said wafer to compensate for said error; and
    performing said second process on said semiconductor wafer based upon said adjustment process.

2. The method described in claim 1, wherein acquiring integrated metrology data related to said first process of said semiconductor wafer comprises acquiring metrology data using an integrated metrology tool.

3. The method described in claim 2, wherein performing an integrated metrology data feed-forward process further comprises:
    receiving notification of completion of said first process on said semiconductor wafer;
    identifying said semiconductor wafer for metrology analysis; and
    acquiring integrated metrology data of said identified semiconductor wafer using said integrated metrology tool.

4. The method described in claim 1, wherein identifying at least one error on said semiconductor wafer based upon said integrated metrology data related to said first process of said semiconductor wafer further comprises:
    comparing said integrated metrology data to a predetermined range of tolerance;
    determining that an error exists in response to a determination that at least one parameter relating to said integrated metrology data is outside said predetermined range of tolerance based upon said comparison of said integrated metrology data to said predetermine range of tolerance.

5. The method described in claim 4, wherein performing an adjustment process to a second process to be performed on said wafer to compensate for said error further comprises:
    identifying an error on said semiconductor wafer based upon said first process;
    calculating a compensation factor for reducing an effect of said identified error;
    modifying a control input parameter relating to said second process based upon said compensation factor; and
    performing said second process of said semiconductor wafer based upon said modified control input parameter.

6. The method described in claim 5, wherein calculating a compensation factor for reducing an effect of said identified error further comprises calculating at least one of a modified etch time, a modified chemical mechanical polishing time, and a modified exposure dosage.

7. A method, comprising:
    performing a first process on a semiconductor wafer using a processing tool;
    acquiring integrated metrology data related to said first process of said semiconductor wafer, said integrated metrology data comprising data acquired using a metrology tool that is integrated within said processing tool, acquiring said integrated metrology data comprising receiving notification of completion of said first process;
    identifying an error on said semiconductor wafer based upon said integrated metrology data related said first process;
    calculating a compensation factor for reducing an effect of said identified error;
    modifying a control input parameter relating to a second process to be performed on said wafer based upon said compensation factor; and
    performing a second process of said semiconductor wafer based upon said modified control input parameter.

8. The method described in claim 7, wherein identifying at least one error on said semiconductor wafer based upon said integrated metrology data related to said first process of said semiconductor wafer further comprises:
    comparing said integrated metrology data to a predetermined range of tolerance;
    determining that an error exists in response to a determination that at least one parameter relating to said integrated metrology data is outside said predetermined range of tolerance based upon said comparison of said integrated metrology data to said predetermine range of tolerance.

9. The method described in claim 7, wherein calculating a compensation factor for reducing an effect of said identified error further comprises calculating at least one of a modified etch time, a modified chemical mechanical polishing time, and a modified exposure dosage.

10. A system, comprising:
 a processing tool to process a semiconductor wafer;
 an integrated metrology tool integrated with said processing tool, said integrated metrology tool to acquire integrated metrology data;
 a process controller operatively coupled to said processing tool, said process controller to perform an integrated metrology feed-forward operation, said integrated metrology feed-forward operation comprising:
  acquiring integrated metrology data related to a first process of a semiconductor said integrated metrology data comprising data acquired using a metrology tool that is integrated within said processing tool, acquiring said integrated metrology data comprising receiving notification of completion of said first process and identifying said semiconductor wafer for acquiring integrated metrology data
  identifying an error on said semiconductor wafer based upon said integrated metrology data related said first process;
  calculating a compensation factor for reducing an effect of said identified error;
  modifying a control input parameter relating to a second process to be performed on said wafer based upon said compensation factor;
  performing a second process of said semiconductor wafer based upon said modified control input parameter;
 an integrated metrology data storage unit operatively coupled to said process controller, said integrated metrology data storage unit to receive said integrated metrology data; and
 a feed-forward unit operatively coupled to said process controller and said integrated metrology data storage unit, said feed-forward unit to perform said feed-forward function in response to identifying at least one error relating to said process of said semiconductor wafer.

11. The system of claim 10, further comprising:
 a computer system operatively coupled with said feed-forward unit, said computer system to perform at least one calculation of a compensation factor for performing said feed-forward operation;
 a manufacturing model operatively coupled with said computer system, said manufacturing model to generate and modify at least one control input parameter signal;
 a machine interface operatively coupled with said manufacturing model and said processing tool, said machine interface being capable of receiving process recipes from said manufacturing model;
 said processing tool to process semiconductor wafers and to receive at least one control input parameter signal from said machine interface; and
 an integrated metrology tool integrated with said processing tool, said integrated metrology tool to acquire said integrated metrology data and sending said integrated metrology data to said integrated metrology data storage unit.

12. The system of claim 11, wherein said computer system is capable of generating modification data for modifying at least one parameter in said manufacturing model in response to said feed-forward operation.

13. The system of claim 11, wherein said integrated metrology tool is located within said processing tool.

14. An apparatus, comprising:
 means for performing a first process on a semiconductor wafer using a processing tool;
 means for acquiring integrated metrology data related to said first process of said semiconductor wafer using an integrated metrology data tool said integrated metrology data comprising data acquired using a metrology tool that is integrated within said processing tool, acquiring said integrated metrology data comprising receiving notification of completion of said first process and identifying said semiconductor wafer for acquiring integrated metrology data;
 means for identifying an error on said semiconductor wafer based upon said integrated metrology data related said first process;
 means for calculating a compensation factor for reducing an effect of said identified error;
 means for modifying a control input parameter relating to a second process to be performed on said wafer based upon said compensation factors; and
 means for performing a second process of said semiconductor wafer based upon said modified control input parameter.

15. A computer readable program storage device encoded with instructions that, when executed by a computer, performs a method, comprising:
 performing a first process on a semiconductor wafer using a processing tool;
 acquiring integrated metrology data related to said first process of said semiconductor wafer using an integrated metrology tool said integrated metrology data comprising data acquired using a metrology tool that is integrated within said processing tool, acquiring said integrated metrology data comprising receiving notification of completion of said first process and identifying said semiconductor wafer for acquiring integrated metrology data;
 performing an integrated metrology data feed-forward process based upon said integrated metrology data, said integrated metrology feed-forward process comprising identifying at least one error on said semiconductor wafer based upon said integrated metrology data related to said first process of said semiconductor wafer and performing an adjustment process to a second process to be performed on said wafer to compensate for said error; and
 performing said second process on said semiconductor wafer based upon said adjustment process.

16. The computer readable program storage device encoded with instructions that, when executed by a computer, performs the method described in claim 15, wherein acquiring integrated metrology data related to said first process on said semiconductor wafer comprises acquiring metrology data using an integrated metrology tool.

17. The computer readable program storage device encoded with instructions that, when executed by a computer, performs the method described in claim 16, wherein performing an integrated metrology data feed-forward process further comprises:
 receive notification of completion of said first process on said semiconductor wafer;

identifying said semiconductor wafer for metrology analysis; and acquiring integrated metrology data of said identified semiconductor wafer using said integrated metrology tool.

18. The computer readable program storage device encoded with instructions that, when executed by a computer, performs the method described in claim 15, wherein identifying at least one error on said semiconductor wafer based upon said integrated metrology data related to said first process of said semiconductor wafer further comprises:

comparing said integrated metrology data to a predetermined range of tolerance;

determining that an error exists in response to a determination that at least one parameter relating to said integrated metrology data is outside said predetermined range of tolerance based upon said comparison of said integrated metrology data to said predetermine range of tolerance.

19. The computer readable program storage device encoded with instructions that, when executed by a computer, performs the method described in claim 18, wherein performing an adjustment process to a second process to be performed on said wafer to compensate for said error further comprises:

identifying an error on said semiconductor wafer based upon said first process;

calculating a compensation factor for reducing an effect of said identified error;

modifying a control input parameter relating to said second process based upon said compensation factor; and performing said second process of said semiconductor wafer based upon said modified control input parameter.

20. The computer readable program storage device encoded with instructions that, when executed by a computer, performs the method described in claim 19, wherein calculating a compensation factor for reducing an effect of said identified error further comprises calculating at least one of a modified etch time, a modified chemical mechanical polishing time, and a modified exposure dosage.

21. An apparatus, comprising:

a controller to perform a first process on a semiconductor wafer, acquire integrated metrology data related to said first process of said semiconductor wafer using an integrated metrology tool wherein the integrated metrology tool is integrated into a processing tool, acquiring said integrated metrology data comprising receiving notification of completion of said first process and identifying said semiconductor wafer for acquiring integrated metrology data, identify at least one error on said semiconductor wafer based upon said integrated metrology data related to said first process of said semiconductor wafer, and perform an adjustment process to a second process to be performed on said wafer to compensate for said error.

22. The apparatus of claim 21, wherein said integrated metrology tool is located within a processing tool.

\* \* \* \* \*

UNITED STATES PATENT AND TRADEMARK OFFICE
CERTIFICATE OF CORRECTION

PATENT NO. : 6,708,075 B2
DATED : March 16, 2004
INVENTOR(S) : Thomas J. Sonderman, Alexander J. Pasadyn and Christopher A. Bode It is certified that error appears in the above-identified patent and that said Letters Patent is hereby corrected as shown below:

Column 7,
Line 33, replace "metro logy" with -- metrology --.

Signed and Sealed this

Twenty-fifth Day of May, 2004

JON W. DUDAS
*Acting Director of the United States Patent and Trademark Office*